United States Patent [19]

Taguchi

[11] Patent Number: 4,868,007

[45] Date of Patent: Sep. 19, 1989

[54] METHOD AND APPARATUS FOR FORMING A THICK FILM INTEGRATED CIRCUIT

[75] Inventor: Katsuhiko Taguchi, Hachiozi, Japan

[73] Assignee: Juki Corporation, Tokyo, Japan

[21] Appl. No.: 246,760

[22] Filed: Sep. 20, 1988

[30] Foreign Application Priority Data

Sep. 22, 1987 [JP] Japan .................. 62-237959

[51] Int. Cl.$^4$ .................. B05C 11/00; B05D 5/12
[52] U.S. Cl. .................. 427/96; 427/256; 118/696; 118/697
[58] Field of Search .............. 118/697, 696, 263, 410; 427/96, 256

[56] References Cited

U.S. PATENT DOCUMENTS

| | | | |
|---|---|---|---|
| 2,264,632 | 12/1941 | Gerlitzki | 118/263 |
| 4,569,305 | 2/1986 | Ferri | 118/263 |
| 4,572,103 | 2/1986 | Engel | 118/697 |
| 4,661,368 | 4/1987 | Rohde | 427/96 |
| 4,753,824 | 6/1988 | Toda | 118/697 |

Primary Examiner—Shrive Beck
Assistant Examiner—Vi Duong Dang
Attorney, Agent, or Firm—Morgan & Finnegan

[57] ABSTRACT

A method and apparatus for forming thick-film integrated circuits provides a secondary up-down mover which prevents a nozzle from being damaged. A spring is applied to the secondary mover as a shock-absorber acting when the nozzle descends to a substrate. A restrictor is provided which restricts the action of the secondary up-down mover by solenoid action, such that the nozzle is accurately ascended from the substrate by a predetermined dimension with the secondary up-down mover in the restricted condition.

6 Claims, 7 Drawing Sheets

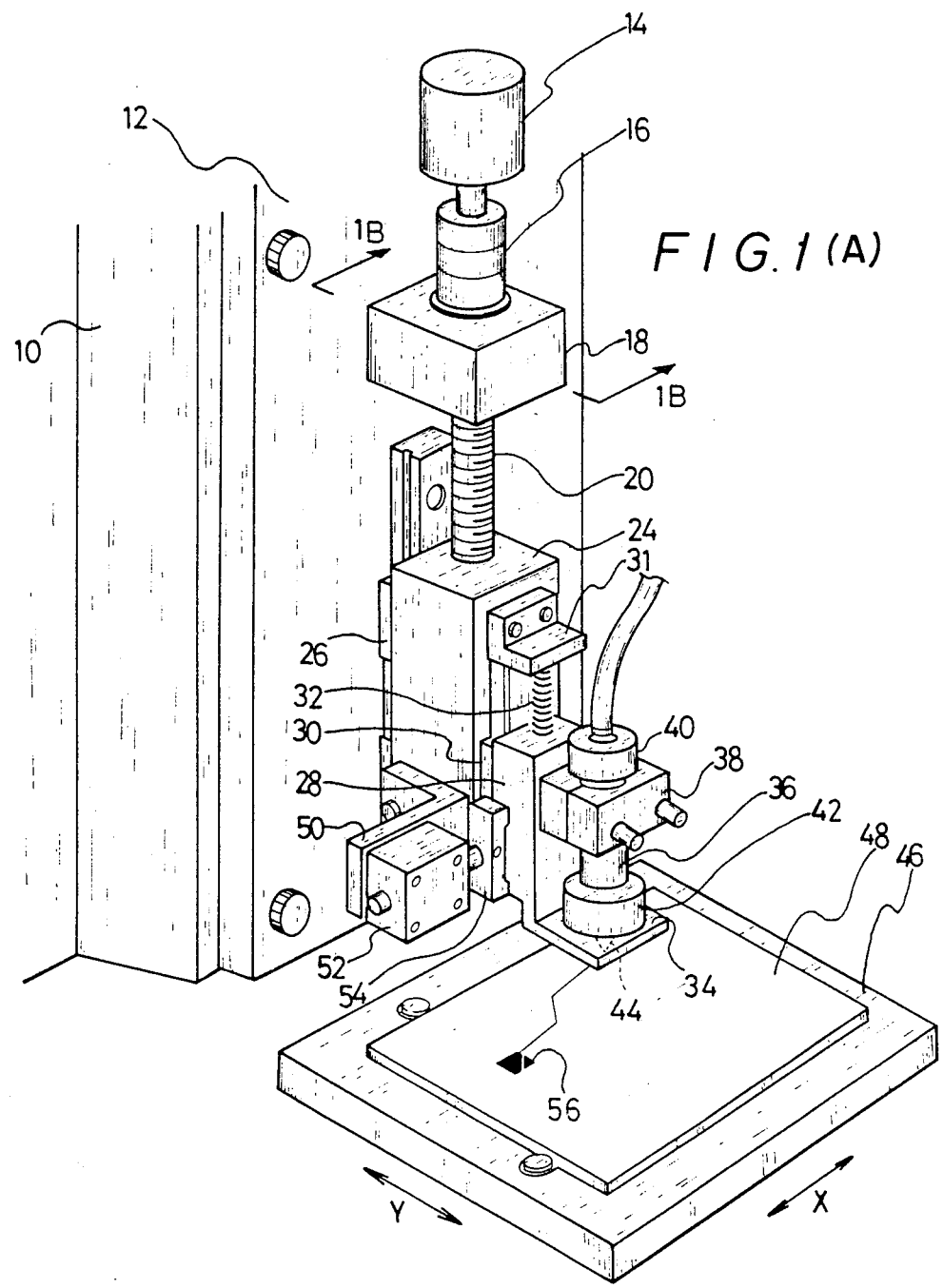
F I G. 1 (A)

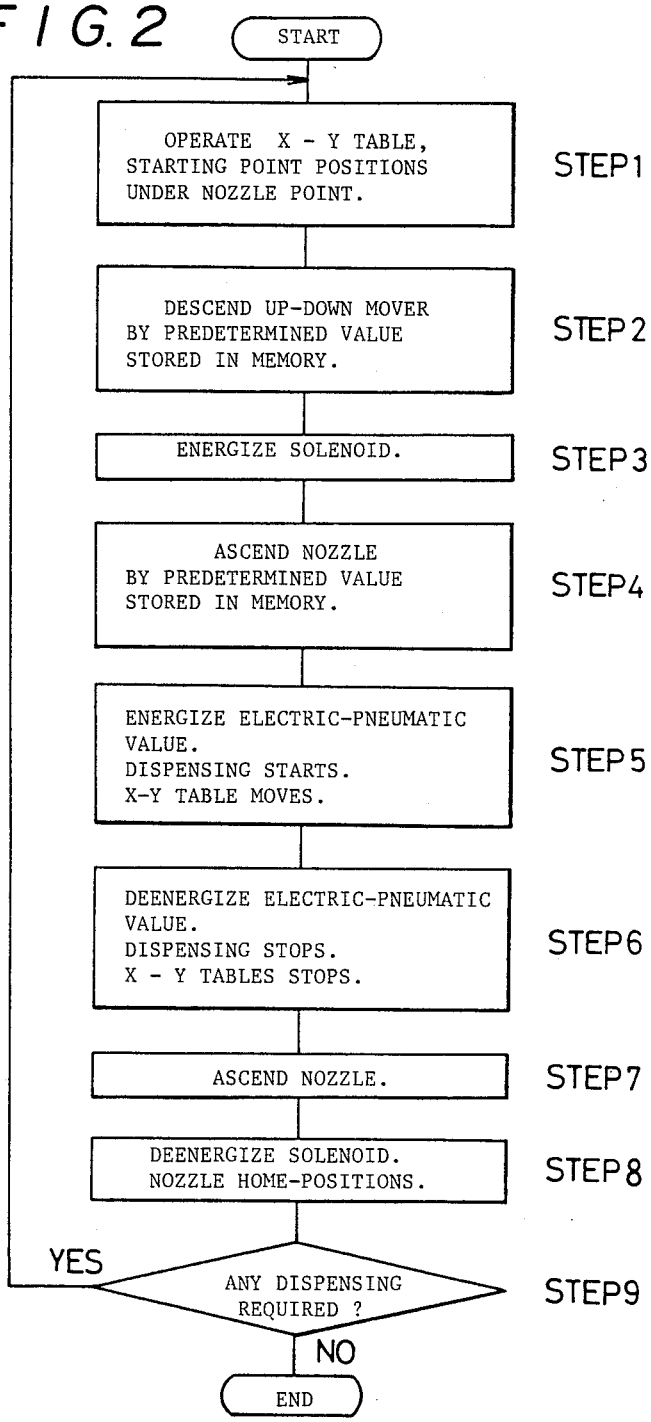

F I G. 3
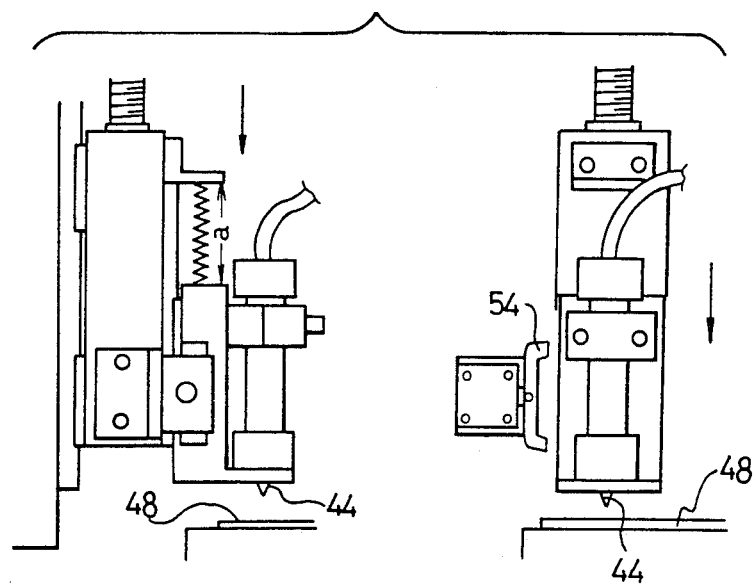
F I G. 4
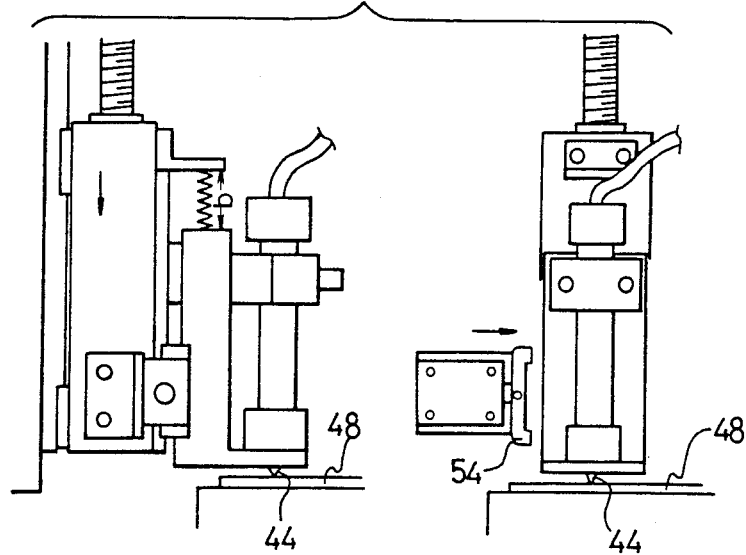

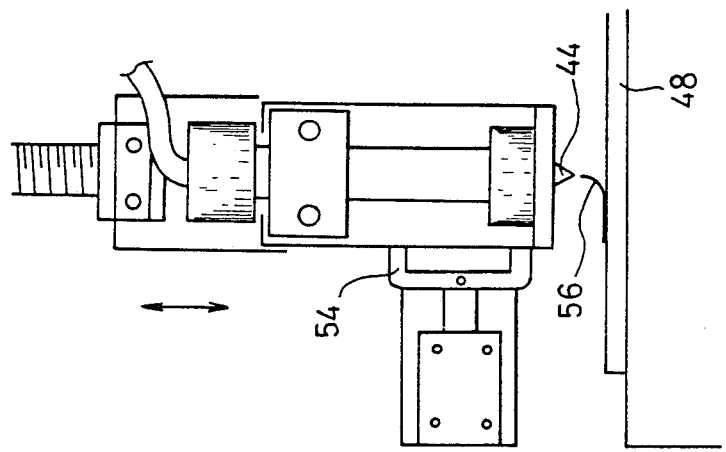
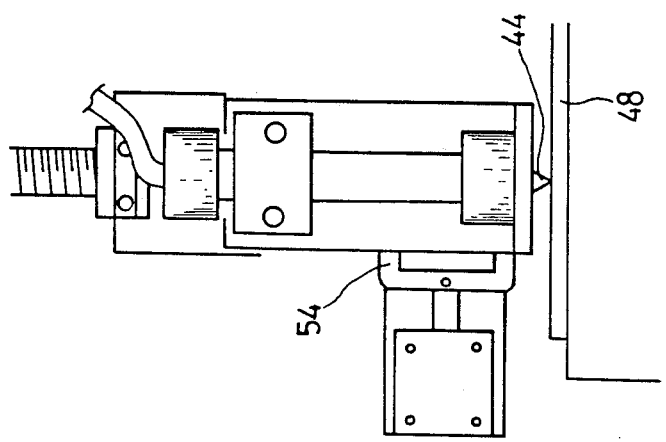

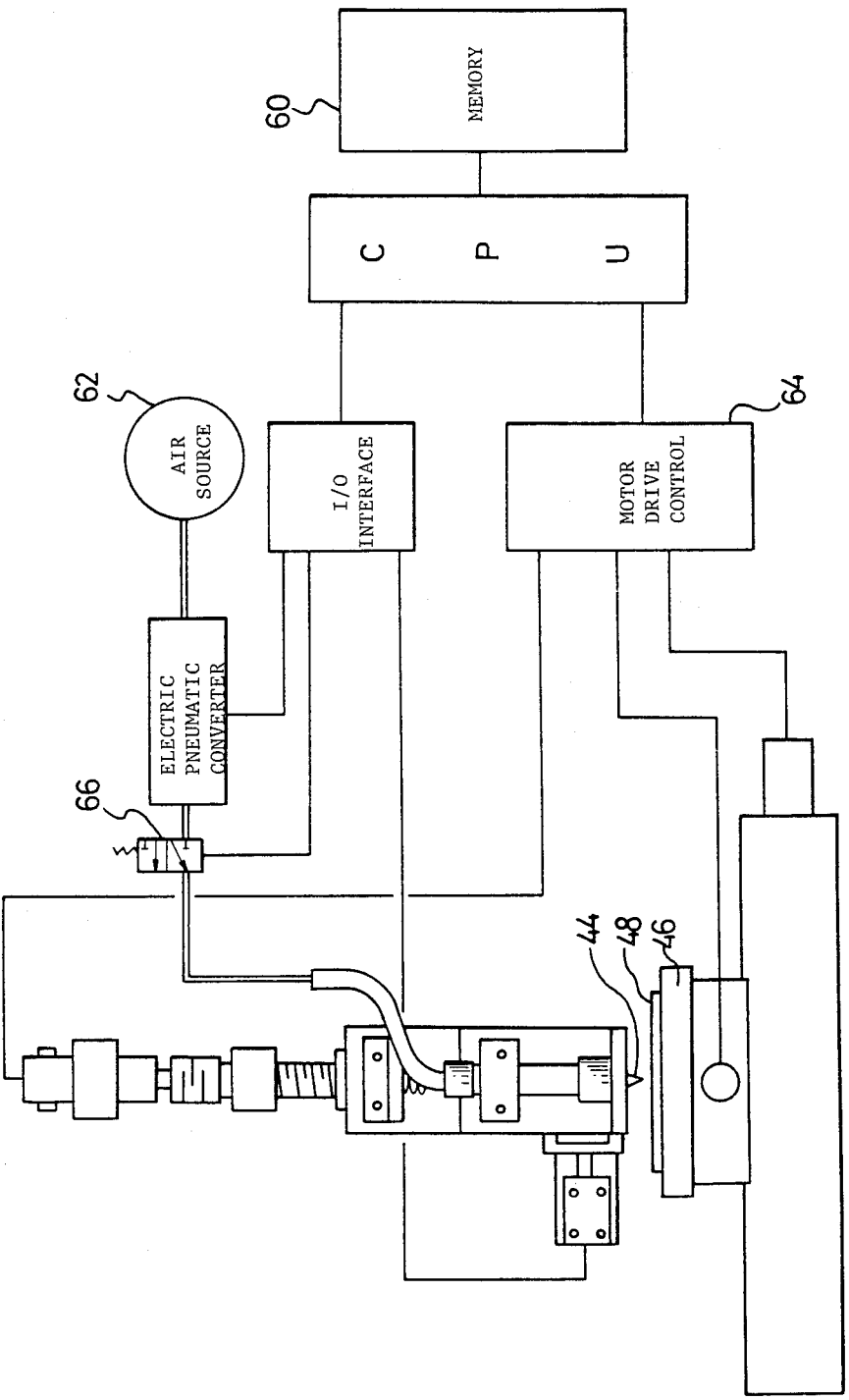

METHOD AND APPARATUS FOR FORMING A THICK FILM INTEGRATED CIRCUIT

BACKGROUND OF THE INVENTION

The invention relates to an apparatus for dispensing a so-called "paste" on the surface of a ceramic subtrate for forming a thick film integrated circuit. Such an apparatus is sometimes referred to as a direct writing machine. More particularly, the invention pertains to a method and apparatus for accurately positioning a dispensing nozzle such that accurate spacing between the dispensing nozzle and the subtrate is maintained.

There are many kinds of pastes for forming a thick film integrated circuit. For instance, there are electrically conductive natured pastes, non-conductive natured pastes, and resistive natured pastes. These pastes are typically charged separately into each nozzle. During dispensing, a nozzle tank with a nozzle at its bottom is attached to the circuit-forming-apparatus such that the paste is dispensed from the nozzle. When the paste tank is to be changed, the present tank with its nozzle attached thereto is removed from the apparatus and the new required nozzle tank with its nozzle is installed. Thus, a hybrid circuit may be formed.

During the dispensing process, the dimension between the nozzle and the subtrate is, for example, between 0.06mm and 0.08mm. To form the circuit smoothly, whenever the tank is changed, this dimension must be checked again.

Referring to FIG. 8, one conventional way of setting this dimension will be explained. FIG. 8 illustrates a sensor S, an X-Y table on which a subtrate is placed, a tank T, a nozzle N, a motor M, a rail R, and an up-down mover H driven by a motor M.

To position the nozzle at the predetermined height, firstly, the nozzle is lowered by the motor M along the rail R, until it touches the touch sensor S. Secondly, the nozzle N is moved horizontally to the X-Y table such that an accurate spacing dimension between the nozzle and the X-Y table is secured.

According to the prior art, when the nozzle N touches the sensor S, the paste sticks at the surface of sensor S. Thereby, it is hard to get an accurate positioning of the nozzle N. Besides, the sensor S is often damaged because it is located near the X-Y table Ta.

It is therefore an object of the invention to eliminate the aforementioned demerits.

SUMMARY OF THE INVENTION

These and other objects of the invention are met by providing a method and apparatus for forming a thick film integrated circuit wherein the tank T with its nozzle N attached thereto is not directly fixed to the up-down mover R (FIG. 8), but is instead fixed to a secondary up-down mover which is slidably attached to the up-down mover. The secondary up-down mover is shock-absorbed by a spring such that the nozzle tip end is prevented from being damaged by the X-Y table when the nozzle descends and presses against the X-Y table with excessive pressure.

In preferred embodiments, a restrictor restricts the movement of the secondary up-down mover by solenoid action. The restrictor is provided such that accurate dimensions can be maintained by ascending the secondary up-down mover with the restrictor in its restricted condition.

BRIEF DESCRIPTION OF THE DRAWINGS

The invention will be described in greater detail below by way of reference to the following drawings, wherein:

FIG. 1A is a perspective drawing of an apparatus for forming a thick film integrated circuit according to the present invention;

FIG. 2 is a flow chart according to the present invention;

FIG. 3 to FIG. 6 explain the step-wise operation of the invention and indicate the positional relationship between a nozzle, a subtrate, a solenoid operated holding arm and spring strain;

FIG. 7 is a control block diagram of a method and apparatus for forming a thick film integrated circuit according to the present invention.

DETAILED DESCRIPTION OF THE DRAWINGS

Figure 1B:
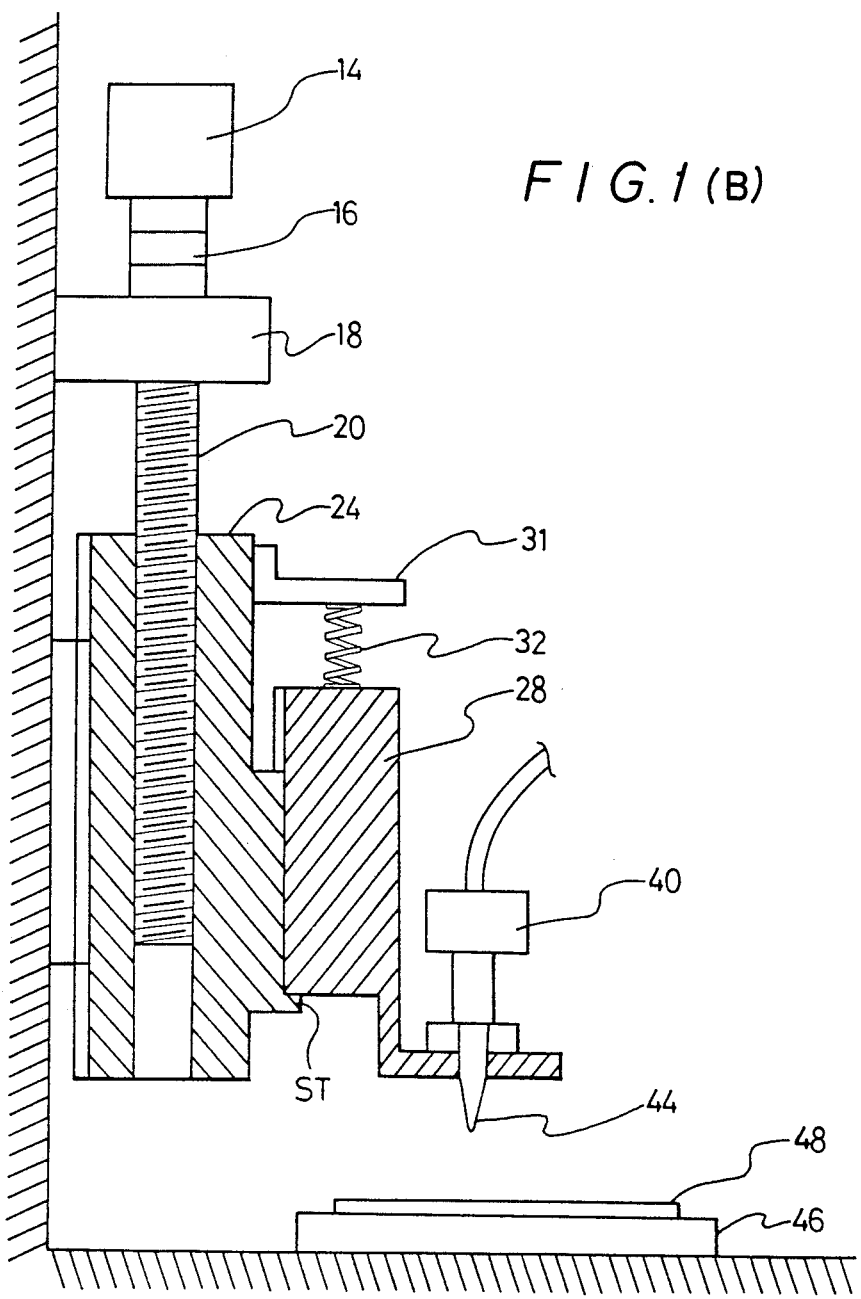
FIG. 1B is a partial section view of the drawing of FIG. 1A.
Figure 8:
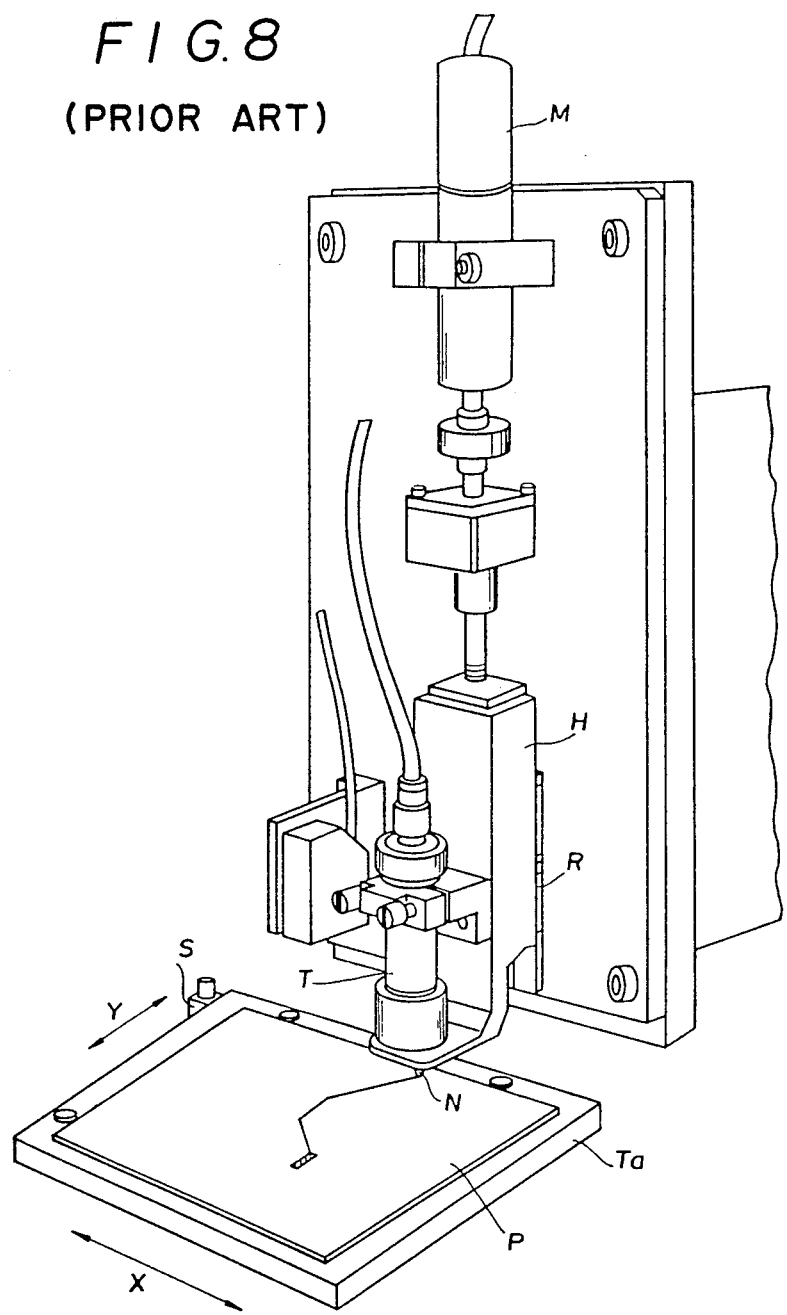
FIG. 8 is a perspective drawing of a conventional apparatus for forming a thick film integrated circuit.

Referring to FIG. 1, one preferred embodiment of the present invention will be explained. FIG. 1 illustrates a machine frame 10 and a standard 12 fixed to the frame 10. A bearing support 18 is fixed to the standard 12. A motor 14 placed on the bearing support 18 rotates a ball screw shaft 20 via a coupling 16 such that an up-down mover 24 moves vertically along a linear guide 26 which is fixed to the standard 12.

A secondary up-down mover 28 is slidably attached to the standard via a guide rail 30 which is fixed to the up-down mover 24. The secondary up-down mover 28 provides a projection 34 such that a tank 36 with a nozzle 44, a nozzle holder 42, a tank holder 38 and an air supply connector 40 are detachably attached on the projection 34.

Referring to FIG. 1B, a projected stopper 31 is provided at the lower-end of the guide rail 30. A spring 32 is placed between the stopper 31 and the second up-down mover 28. The spring 32 urges the secondary up-down mover 28 to press down with a light force. The spring 32, the secondary up-down mover 28 and the guide rail 30 constitute a secondary driving unit.

Further illustrated in FIG. 1A is a conventional X-Y table 46 which moves freely in the X-Y direction, a subtrate 48 on which the paste is dispensed from the nozzle 44 and an angle body 50 fixed to the up-down mover 24. A solenoid 52 provides a holding arm 54 which presses the side of the secondary up-down mover 28 to restrict the movement of the secondary up-down mover 28 when the solenoid 52 is energized. The solenoid 52 is fixed to the angle body 50.

In these drawings, only one solenoid is provided, but two solenoids placed at both sides of the secondary up-down mover may alternatively be provided. Providing some elastic portion at the tip of the holding arm 54 to absorb the contacting shock is recommended.

Since the secondary up-down mover 28 has its own weight, preferably slides smoothly and is stopped by the stopper ST (FIG. 1B), the spring 32 may be eliminated. However, use of the spring may be preferred.

Referring to FIG. 2 thru FIG. 7, the operation of the present embodiment will be explained. As the first step, the tank 36 and the nozzle 44 are attached correctly to the secondary up-down mover 28, which is positioned at the home-position (zero point). Then, the starting point of the dispensing is moved to be positioned just under the nozzle 44 by operating the X-Y table 46. During the above process, the solenoid 52 is not energized, so the secondary up-down mover 28 is pressed downward by the spring 32 to the stopper ST.

Then, as the second step, the motor 14 rotates to cause the up-down mover 24 to descend slowly. As a result, the nozzle 44 descends slowly to the subtrate. When the up-down mover 24 has descended by a predetermined value (which value may be memorized at a memory 60 shown in FIG. 7), the nozzle 44 contacts the subtrate 48 and further presses the subtrate. The spring 32 absorbs this pressure so that the tip point of the nozzle 44 will not be damaged. Thus, the spring 32 is contracted.

Then, as the third step, the solenoid 52 energizes, so the holding arm 54 firmly presses the secondary up-down mover 28 such that the secondary up-down mover 28 is held unmoved.

Under such a condition, as the fourth step, the motor 14 rotates to ascend the nozzle 44 by, for example, 0.06 mm which is the most recommendable spacing dimension for dispensing the paste, and this 0.06 mm has already been memorized in the memory 60.

Then, as the fifth step, an electric-pneumatic switch 66 (FIG. 7) energizes to send air from an air source 62 to the nozzle 44 such that the paste is dispensed. Simultaneously, the X-Y table moves in accordance with the predetermined program via a motor-controller 64. Thus, the dispensing of the paste is conducted.

When the dispensing is finished, as the sixth step, the electric-pneumatic switch 66 deenergizes to shut-off the air supply to the nozzle and simultaneously the X-Y table stops.

Then, as the seventh step, the motor 14 rotates to cause the nozzle 44 to ascend to the home-position. During this ascending process, the holding arm 54 is still restricting the secondary up-down mover 28.

Then, as the eighth step, the solenoid 52 deenergizes to release the holding arm 54 such that the secondary up-down mover 28 is pressed down to the stopper ST by the spring 32. Thus, the home-position of nozzle 44 is secured.

As the ninth step, if further dispensing work is needed, the aforementioned steps are repeated.

Thus, according to the present invention, whenever the paste dispensing work starts, spacing dimension between the nozzle and the subtrate is automatically secured, and the tip of the nozzle is shock-absorbed when it contacts the subtrate.

As many apparently widely different embodiments of the invention may be made without departing the spirit and scope therein, it is to be understood that invention is not limited to the specific embodiments herein disclosed and is defined only in accordance with the following claims.

What is claimed is:

1. A method for controlling a direct writing machine for forming a thick film integrated circuit, said machine having paste supply means with a nozzle for dispensing paste onto a substrate, a main driving means, a first movable member vertically driven by the main driving means, a second movable member mounting thereon the nozzle, and a secondary driving means for moving the second movable member independently from the main driving means, said method comprising the steps of:

(a) descending the nozzle to a start point on the substrate by operation of said main driving means;
    (b) holding the second movable member at a fixed position relative to the first movable member when said nozzle is at said start point by operation of a holding means so that the second movable member thereafter moves together with said first movable member;
    (c) ascending the nozzle a predetermined distance while said second movable member is in said held condition;
    (d) dispensing paste from the nozzle via paste supplying means onto said substrate to draw a predetermined circuit while said second movable member remains in said held condition; and
    (e) stopping paste supply when the nozzle reaches an end point on said substrate.

2. An apparatus for controlling a direct writing machine for forming a thick film integrated circuit by dispensing paste onto a surface of a substrate, comprising:

an X-Y table for receiving the substrate, said X-Y table being movable in the X-Y direction;
    means for supplying paste on to said substrate to form a predetermined circuit, said means including a nozzle;
    main drive means;
    a first movable member driven vertically relative to said substrate by said main drive means;
    a second movable member mounting thereon said supplying means;
    secondary drive means for driving said second movable member vertically relative to said substrate, said secondary drive means operating independently of said main drive means; and
    holding means engaged to said first movable member for temporarily holding said second movable member relative to said first movable member so that, upon actuation of said holding means, said second movable member moves under control of said main drive means together with said first movable member at a fixed position relative to said first movable member.

3. An apparatus for controlling a direct writing machine for forming a thick film integrated circuit, as recited in claim 2, in which said secondary driving means comprises:

a guide rail for guiding said second movable member; and
    an elastic member connected between said first movable member and said second movable member to urge downwardly said second movable member.

4. An apparatus for controlling a direct writing machine for forming a thick film integrated circuit, as recited in claim 2, in which said holding means comprises:

a solenoid, and
    a holding arm actuated by said solenoid and adapted to engage said second movable member by operation of said solenoid.

5. An apparatus for controlling a direct writing machine for forming a thick film integrated circuit, as recited in claim 2, in which said secondary drive means is mounted about a guide rail and has mass heavy enough to be moved along the guide rail and light enough not to damage the tip-end of a nozzle when the secondary up-down mover descends and contacts said substrate.

6. An apparatus for controlling a direct writing machine for forming a thick film integrated circuit, as recited in claim 2, further comprising:

means for energizing said holding means when said nozzle is in contact with said substrate, and
means for ascending said nozzle a predetermined distance while said second movable member is in a held condition.

* * * * *